US012656620B2

(12) United States Patent
Smith et al.

(10) Patent No.: US 12,656,620 B2
(45) Date of Patent: Jun. 16, 2026

(54) OPTICAL DELAY SYSTEM

(71) Applicant: NIKON CORPORATION, Tokyo (JP)

(72) Inventors: Daniel Gene Smith, Tucson, AZ (US);
Brian Lee Stamper, Tucson, AZ (US)

(73) Assignee: NIKON CORPORATION, Tokyo (JP)

( * ) Notice: Subject to any disclaimer, the term of this
patent is extended or adjusted under 35
U.S.C. 154(b) by 968 days.

(21) Appl. No.: 17/893,912

(22) Filed: Aug. 23, 2022

(65) Prior Publication Data

US 2023/0015748 A1      Jan. 19, 2023

Related U.S. Application Data

(63) Continuation of application No.
PCT/US2020/019742, filed on Feb. 25, 2020.

(51) Int. Cl.
G02B 27/48 (2006.01)
G02B 27/09 (2006.01)
G02B 27/14 (2006.01)
G03F 7/00 (2006.01)

(52) U.S. Cl.
CPC ..... G02B 27/0961 (2013.01); G02B 27/0905
(2013.01); G02B 27/0944 (2013.01); **G02B
27/145 (2013.01); G02B 27/48** (2013.01);
G03F 7/70583 (2013.01)

(58) Field of Classification Search
CPC .. G02B 27/0905; G02B 27/145; G02B 27/48;
G02B 27/144; G02B 17/0856; G02B
27/0983
See application file for complete search history.

(56) References Cited

U.S. PATENT DOCUMENTS

| | | | |
|---|---|---|---|
| 6,731,374 B1 | 5/2004 | Sewell | |
| 7,199,862 B2 * | 4/2007 | Sewell | G03F 7/70225 |
| | | | 359/730 |
| 2004/0174617 A1 | 9/2004 | Sewell | |
| 2012/0271111 A1 * | 10/2012 | Namiki | G02B 21/0084 |
| | | | 359/205.1 |
| 2021/0131960 A1 | 5/2021 | Nejdl et al. | |

FOREIGN PATENT DOCUMENTS

| | | |
|---|---|---|
| CN | 1504829 A | 6/2004 |
| DE | 102004026518 A1 | 12/2005 |
| JP | 2004-186689 A | 7/2004 |
| JP | 2014239088 A * | 12/2014 |

(Continued)

OTHER PUBLICATIONS

Jun. 30, 2025 Office Action issued in Chinese Patent Application
No. 202080098712.5.

(Continued)

*Primary Examiner* — Ryan D Howard
(74) *Attorney, Agent, or Firm* — Oliff PLC

(57) ABSTRACT

An optical system includes a first optical system, a second
optical system, and a third optical system. The first optical
system divides an input beam into a first light and a second
light. The second optical system includes a concave reflec-
tive surface which reflects the first light. The third optical
system directs at least one of the first light reflected from the
second optical system and the second light from the first
optical system to an output optical path of the third optical
system.

35 Claims, 8 Drawing Sheets

Input Beam    Curvatures
minimize
beam size

Telecentric

Spatially displaced,
but parallel, beams

(56)          References Cited

FOREIGN PATENT DOCUMENTS

| JP | 2022-522746 A | 4/2022 |
| KR | 10-2004-0048359 A | 6/2004 |
| WO | 2020/182238 A1 | 9/2020 |

OTHER PUBLICATIONS

Dec. 14, 2020 International Search Report issued in International Patent Application No. PCT/US2020/019742.

Dec. 14, 2020 Written Opinion of the International Searching Authority issued in International Patent Application No. PCT/US2020/019742.

Jul. 16, 2024 Office Action issued in Korean Patent Application No. 10-2022-7032694.

Nov. 21, 2023 Office Action issued in Japanese Patent Application No. 2022-550886.

Jan. 17, 2025 Office Action issued in Chinese Patent Application No. 202080098712.5.

* cited by examiner

Input Beam 200   202

204

Curvatures minimize beam size

208

210

206

214

212

218

216   219

Polarization Relay   220

Telecentric

222

Spatially displaced, but parallel, beams p-polarization s-polarization

Spatially Multiplexed TDS    564    566    Fly's Eye    RB 572    560    568    Condenser    570

Tilt and Focus Removed
Phase at 330mm

OPTICAL DELAY SYSTEM

CROSS-REFERENCE TO RELATED APPLICATION

Priority is claimed on International Application PCT/US2020/019742, filed on Feb. 25, 2020. The present application is a continuation application of International Application PCT/US2020/019742, filed on Feb. 25, 2020. The contents of the above application are incorporated herein.

BACKGROUND

Technical Field

For an illumination system for lithography, a non-complex or complex illumination pattern may be required for illuminating a target surface. However, non-complex or complex illumination patterns suffer from speckle noise that arises from interference between different portions of the illumination pattern particularly when a coherent source is used to generate the pattern. This noise deteriorates the quality of the lithographic process and can generate errors.

BRIEF DESCRIPTION OF THE DRAWINGS

Various embodiments of the invention are disclosed in the following detailed description and the accompanying drawings.

DESCRIPTION OF THE EMBODIMENTS

Figure 1:
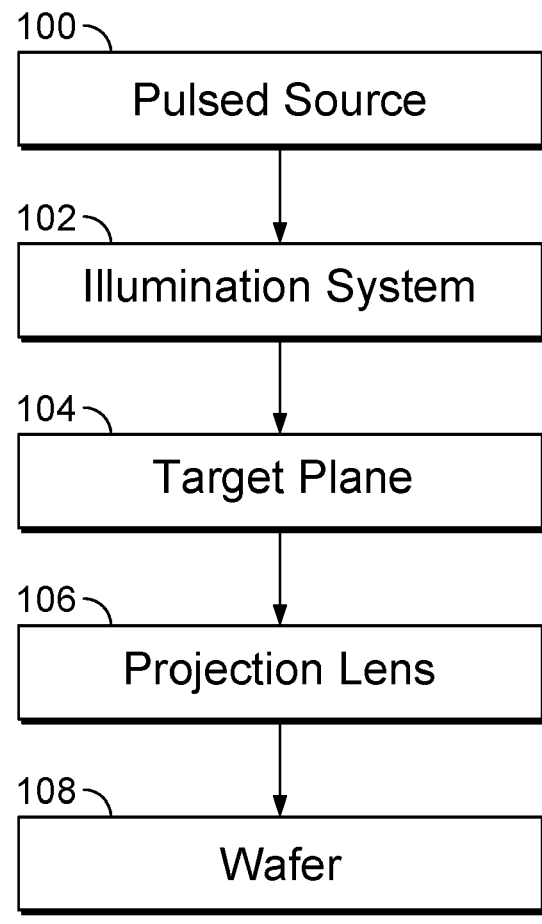
FIG. 1 is a diagram illustrating an embodiment of a system for lithography using an illumination system with an optical delay system.

The invention can be implemented in numerous ways, including as a process; an apparatus, a system; a composition of matter; a computer program product embodied on a computer readable storage medium; and/or a processor, such as a processor configured to execute instructions stored on and or provided by a memory coupled to the processor. In this specification, these implementations, or any other form that the invention may take, may be referred to as techniques.

In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

An optical delay system is disclosed.

In some embodiments, the optical delay system includes a beam divider, an intermediate optical part, and a beam combiner. The beam divider divides an input beam into a first light and a second light and directs the first light and the second light to different directions. The intermediate optical part includes a refractive surface which refracts the first light and a concave mirror which reflects the first light from the refractive surface. The beam combiner directs the first light and the second light from the concave mirror to a same direction, wherein the first light from the concave mirror to the beam combiner passes through the refractive surface.

In some embodiments, the optical delay system includes a beam divider, an intermediate optical part, and a beam combiner. The beam divider divides an input beam into a first light and a second light and directs the first light and the second light to different directions. The beam divider may direct the first light and the second light in a same direction. The intermediate optical part includes a first reflective surface which reflects the first light from the beam divider and which has concave shape, and a second reflective surface which reflects the first beam from the first reflective surface and which directs the first beam to the first reflective surface. The beam combiner directs the first light and the second light from the second reflective surface to a same direction, wherein the first light from the second reflective surface to the beam combiner pass through the first reflective surface. The beam combiner may direct the first light and the second light to different directions.

In some embodiments, the optical or time delay system comprises multiple arms that are traversed such that each beamlet of a set of beamlets traverses a different permutation of the multiple arms in order to reduce temporal coherence between each beamlet of the set of beamlets output by the time delay system. In some embodiments, the time delay system includes multiple time delay arms wherein a light path in an arm of the multiple time delay arms is folded. In various embodiments, the light path in the arm is substantially in glass (e.g., a refractive index of approximately 1.5) or any other appropriate higher than air index of refraction. In some embodiments, the light path in the arm is substantially in air. In some embodiments, the light path is folded N times. In various embodiments, N is 1, 2, 3, 4, 5, 6, 7, 8, 9, 10, or larger, or any other appropriate value.

In some embodiments, an optical system comprises a first optical system which divides an input beam into a first light and a second light; a second optical system including a concave reflective surface which reflects the first light; and a third optical system which directs at least one of the first light reflected from the second optical system and the second light from the first optical system to an output optical path of the third optical system.

In some embodiments, the second optical system includes a refractive member that is arranged between the first optical system and the concave mirror. In some embodiments, the refractive member is arranged between the concave mirror and the third optical system. In some embodiments, the refractive member has a rear focal point substantially positioned on the concave reflective surface. In some embodiments, the second optical system includes a reflective surface which reflects the first light from the concave reflective surface, and wherein the concave reflective surface reflects the first light from the reflective surface of the second optical system. In some embodiments, the system further comprises a refractive member arranged between the concave reflective surface and the reflective surface. In some embodiments, the concave reflective surface and the reflective surface are formed on the refractive member. In some embodiments, the reflective surface has a concave shape. In some embodiments, the reflective surface has a convex shape. In some embodiments, the concave reflective surface faces a beam path of the second light between the first optical system and the third optical system. In some embodiments, the first light from the third optical system and the second light from the third optical system passes through different positions. In some embodiments, the system further comprises a fourth optical system including a concave reflective surface which reflects the first light from the third optical system. In some embodiments, an optical axis of the second optical system and an optical axis of the fourth optical system are decentered from each other. In some embodiments, the third optical system divides the first light from the second optical system into a third light and a fourth light. In some embodiments, the system further comprises a fifth optical system arranged in the output path of the third optical system.

In some embodiments, the optical system comprises a time delay system and a first beamlet array and a second beamlet array. The time delay system generates a set of beamlets with reduced speckle from a coherent input illumination source. The first beamlet array and the second beamlet array steer and shape the set of beamlets to achieve an illumination pattern at a target plane. In various embodiments, the first beamlet array or the second beamlet array comprises one or more of the following: a reflecting surface, a refracting surface, a diffractive element, a hologram, and/or a metasurface, or any other appropriate element. In some embodiments, the illumination pattern comprises an array of beamlets. In various embodiments, the array comprises one of the following: a square array, a rectangular array, an array having the overall shape of an annulus, an array having the overall shape of a dipole, or an array having the overall shape of a quadrupole, or any other appropriate geometry. In some embodiments, the time delay system comprises multiple arms that are traversed such that each beamlet of the set of beamlets traverses a different permutation of the multiple arms in order to reduce temporal coherence between each beamlet of the set of beamlets output by the time delay system. In some embodiments, the coherent input illumination source comprises a pulsed laser. In some embodiments, the system is configured to dispose a reticle at the target plane. In some embodiments, the system is configured to project an image of the reticle on a wafer.

In some embodiments, the time delay system comprises: a beam divider which divides an input beam into a first light and a second light and directs the first light and the second light to different directions; an intermediate optical part including a refractive surface which refracts the first light, and a concave mirror which reflects the first light from the refractive surface; and a beam combiner which directs the first light and the second light from the concave mirror to a same direction, wherein the first light from the concave mirror to the beam combiner passes through the refractive surface.

In some embodiments, the time delay system comprises: a beam divider which divides an input beam into a first light and a second light and directs the first light and the second light to different directions; an intermediate optical part including a first reflective surface which reflects the first light from the beam divider and which has concave shape, and a second reflective surface which reflects the first beam from the first reflective surface and which directs the first beam to the first reflective surface; and a beam combiner which directs the first light and the second light from the second reflective surface to a same direction, wherein the first light from the second reflective surface to the beam combiner pass through the first reflective surface.

In some embodiments, the time delay system includes a set of different sized beamsplitters and arm optics. In some embodiments, the system includes a near field beam shaper to shape the set of beamlets output by the time delay system. In some embodiments, the system includes a far field beam shaper to shape the set of beamlets output by the time delay system. In some embodiments, the time delay system includes multiple time delay arms wherein a light path in an arm of the multiple time delay arms is folded. In some embodiments, the light path in the arm is substantially in glass. In some embodiments, the light path in the arm is substantially in air. In some embodiments, the light path is folded N times.

In some embodiments, the optical system comprises: a beam divider which divides an input beam into a first light and a second light and directs the first light and the second light to different directions; an intermediate optical part including a refractive surface which refracts the first light, and a concave mirror which reflects the first light from the refractive surface; and a beam combiner which directs the first light and the second light from the concave mirror to a same direction, wherein the first light from the concave mirror to the beam combiner passes through the refractive surface. In some embodiments, the time delay system includes a set of different sized beamsplitters and arm optics. In some embodiments, the system includes a near field beam shaper to shape the set of beamlets output by the time delay system. In some embodiments, the system includes a far field beam shaper to shape the set of beamlets output by the time delay system. In some embodiments, the time delay system includes multiple time delay arms wherein a light path in an arm of the multiple time delay arms is folded. In some embodiments, the light path in the arm is substantially in glass. In some embodiments, the light path in the arm is substantially in air. In some embodiments, the light path is folded N times.

In some embodiments, the optical system comprises: a beam divider which divides an input beam into a first light and a second light and directs the first light and the second light to different directions; an intermediate optical part including a refractive surface which refracts the first light, and a concave mirror which reflects the first light from the refractive surface, and a beam combiner which directs the first light and the second light from the concave mirror to a same direction, wherein the first light from the concave mirror to the beam combiner passes through the refractive surface. In some embodiments, the intermediate optical part including an optical axis, and wherein the first light entering the intermediate optical part is decentered from the optical axis. In some embodiments, a midpoint between a beam divided point at the beam divider and a beam passing point of the second light on a beam combined surface of the beam combiner is decentered from the optical axis of the intermediate optical part. In some embodiments, the system further includes a second intermediate optical part including a refractive surface which refracts the first light and the second light from the beam combiner and a concave mirror which reflects the first light and the second light from the refractive surface. In some embodiments, a first separation between the refractive surface of the intermediate optical part and the concave mirror of the intermediate optical part is smaller than a second separation between the refractive surface of the second intermediate optical part and the concave mirror of the second intermediate optical part.

In some embodiments, the optical system comprises: a beam divider which divides an input beam into a first light and a second light and directs the first light and the second light to different directions; an intermediate optical part including a first reflective surface which reflects the first light from the beam divider and which has concave shape, and a second reflective surface which reflects the first beam from the first reflective surface and which directs the first beam to the first reflective surface; and a beam combiner which directs the first light and the second light from the second reflective surface to a same direction, wherein the first light from the second reflective surface to the beam combiner pass through the first reflective surface.

In various embodiments, the optical system elements are each provided. In various embodiments, the optical system elements are each disposed to enable their function (e.g., providing an optical time delay).

FIG. 1 is a diagram illustrating an embodiment of a system for lithography using an illumination system with an optical delay system. In the example shown, the system includes pulsed source 100, illumination system 102, target plane 104, projection lens 106, and wafer 108.

Pulsed source 100 (e.g., a pulsed laser source) produces light to be used for illuminating a target in target plane 104 in order to project an image of the target on wafer 108 using projection lens 106 (e.g., an image of a reticle at the target plane onto a wafer to perform lithography). The light produced by pulsed source 100 is processed using illumination system 102 to produce multiple beams with a low degree of speckle by reducing coherence between the multiple beams.

Illumination system 102 is designed to work with pulsed source 100 which is a laser source that provides a very coherent pulsed beam. The coherent pulsed beam is almost single mode, has a very narrow bandwidth, and is nearly transform limited—meaning that the pulse length is almost as short as physics will allow, or that the coherence length is approximately equal to the pulse length.

The optical delay system of the illumination system splits the beam into $2^N$ copies, offsets each one so that they are separated by an axial distance (or time). In some embodiments, the time is longer than the coherence length (or time). In some embodiments, the delay is a bit shorter than the coherence length to obtain partial reduction is speckle so that the total pulse-train-length is not too long. The problem with a long pulse train is that it results in a smeared image in a scanning system. The optical or time delay system also displaces each beam laterally (e.g., perpendicular to the propagation direction) so that they can be repositioned at the desired locations in the illumination pupil by the beam shaping optics. The beam shaping optics does two things: 1) it takes the spatially separated beams and directs them to desired locations in the illumination pupil and 2) it forms the shape of each beam so that it provides the desired irradiance distribution at target plane 104. The desired pupil distribution is a set of points that are chosen to improve the lithography process. The points might be placed in a ring, equally spaced within a disk or annulus, gathered together in two smaller discs (dipole), or anything else. The desired irradiance distribution is usually uniform over some rectangular area, but could be anything in principle. The optical delay system may be combined with a light source which provides a pulsed or non-pulsed (continuous) beam.

Optical Delay System with Dyson-Type Relays

The problem of providing $2^N$ time-delayed beams (to reduce the temporal coherence of a pulsed source) that are parallel, but regularly spaced in position, is solved by relaying the beam between N+1 beam splitters using a Dyson-type system consisting of one lens and one mirror. The delayed beams from the different arms are combined in different combinations and produce a set of temporally less coherent beams at a target surface. The delayed beams are also each spatially displaced also in different combinations to produce a pattern at a target surface.

The system begins with an array of 50% beamsplitters that send half each beam down N delay arms. In some embodiments, the beamsplitters do not have 50% transmission and reflection. In this case, some measures must be taken to equalize the beam powers. One approach is to modify the reflection coatings of the Dyson mirrors, or to place an attenuating filter somewhere in the Dyson (between the beamsplitter and lens, or between lens and mirror). In this disclosure, the delay arms include one lens and one mirror (placed at the back focal plane of the lens) comprising, what we call here, a Dyson relay and is illustrated below. The position of the optical axis of the Dyson relay relative to the beam axis entering the relay determines the position at its output, so the position is chosen to generate a displacement of the output beam(s). This displacement can be generated in our out of the plane of the page, so that the final array of spots can be any shape desired—most likely a rectangular array is wanted as shown below. In some embodiments, the Dyson relay is referred to as an in-mirror relay.

Figures 2A, 2B:
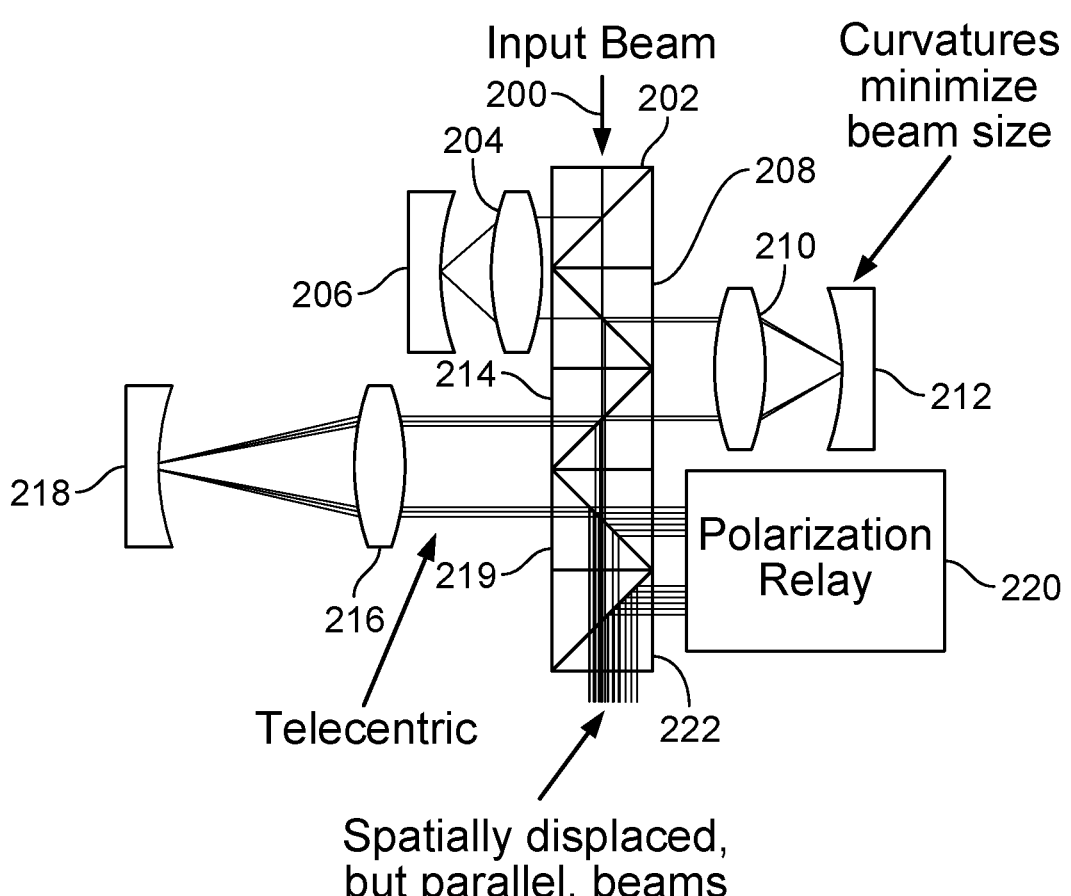
FIG. 2A is a diagram illustrating an embodiment of an optical delay system.
FIG. 2B is a diagram illustrating an embodiment of the output pattern at the target plane for an optical delay system.

FIG. 2A is a diagram illustrating an embodiment of an optical delay system. In some embodiments, optical delay system of FIG. 2A is used to implement an optical delay system of an illumination system (e.g., illumination system 102 of FIG. 1). In the example shown, optical delay system receives an input beam 200 from a laser source (e.g., a pulsed laser source). Input beam 200 is partially reflected (e.g., first reflected ray) and partially transmitted (e.g., first transmitted ray) by beamsplitter 202. The first reflected ray is focused by lens 204 onto curved reflector 206 (e.g., in a Dyson lens configuration such that an entering light ray exits parallel to the entering ray but in the opposite direction) and is reflected back (e.g., first reflected back ray) and is made parallel to the entering first reflected ray by lens 204 (e.g., first exiting ray). In some embodiments, the first reflected ray and the first reflected back ray form a slight angle. In various embodiments, lens 204, lens 210, and/or lens 216 have a positive optical power. In various embodiments, curved reflector 206, curved reflector 218, and or curved reflector 222 have a concave-shaped reflecting surface. In some embodiments, lens 204 and the curved reflector 206 are arranged along a common optical axis. In some embodiments, the common optical axis is decentered from a virtual ridge line of beam splitting surfaces of beamsplitter 202. The first transmitted ray may not be focused onto the curved reflector 206, in other words, light spot formed by the lens 204 on the curved reflector 206 may spread to have a large area.

The first exiting ray is partially reflected (e.g., second reflected ray) and partially transmitted (e.g., second transmitted ray) by beamsplitter 208. The first transmitted ray is also transmitted to beamsplitter 208, enters beamsplitter 208 orthogonal to the first exiting ray, and is partially reflected (e.g., propagating parallel to the second transmitted ray and which will travel similar to the second transmitted ray) and partially transmitted (e.g., propagating parallel to the second reflected ray and which will travel similar to the second reflected ray).

The second transmitted ray is focused by lens 210 onto a curved reflector 222 (e.g., in a Dyson lens configuration such that an entering light ray exits parallel to the entering ray but in the opposite direction) and is reflected back (e.g., second reflected back ray) and is made parallel to the entering first exiting ray by lens 210 (e.g., second exiting ray). The second transmitted ray may not be focused onto the curved reflector 212, in other words, light spot formed by the lens 210 on the curved reflector 212 may spread to have a large area.

The second exiting ray is partially reflected (e.g., third reflected ray) and partially transmitted (e.g., third transmitted ray) by beamsplitter 214. The second reflected ray is also transmitted to beamsplitter 214, enters beamsplitter 214 orthogonal to the second exiting ray, and is partially reflected (e.g., propagating parallel to the third transmitted ray and which will travel similar to the third transmitted ray) and partially transmitted (e.g., propagating parallel to the third reflected ray and which will travel similar to the third reflected ray).

The third transmitted ray is focused by lens 216 onto a curved reflector 218 (e.g., in a Dyson lens configuration such that an entering light ray exits parallel to the entering ray but in the opposite direction) and is reflected back (e.g., third reflected back ray) and is made parallel to the entering first exiting ray by lens 216 (e.g., third exiting ray). The third transmitted ray may not be focused onto the curved reflector 218, in other words, light spot formed by the lens 216 on the curved reflector 218 may spread to have a large area.

The third exiting ray is partially reflected (e.g., fourth reflected ray) and partially transmitted (e.g., fourth transmitted ray) by beamsplitter 219. The third reflected ray is also transmitted to beamsplitter 219, enters beamsplitter 219 orthogonal to the third exiting ray, and is partially reflected (e.g., propagating parallel to the fourth transmitted ray and which will travel similar to the fourth transmitted ray) and partially transmitted (e.g., propagating parallel to the fourth reflected ray and which will travel similar to the fourth reflected ray).

The fourth transmitted ray is enters polarization relay 220 that generates oppositely-polarized oppositely-propagating parallel beams that are reflected by polarizing beamsplitter 222 to generate final exit beams parallel to initial input beam 200. Also, fourth reflecting beam is transmitted through polarizing beamsplitter 222 to be final exit beams also parallel to initial input beams 200.

In some embodiments, polarization relay 220 (which may be another Dyson) doubles the number of spots, but produces them at the orthogonal polarization (which could be linear, circular, or elliptical in general, but is most likely s- and p-polarization since this could be easily implemented with a half-wave-plate and a PBS as the last beam splitter.

FIG. 2B is a diagram illustrating an embodiment of the output pattern at the target plane for an optical delay system. In some embodiments, the output pattern of FIG. 2B is generated using the optical delay system of FIG. 2 A.

Figure 3:
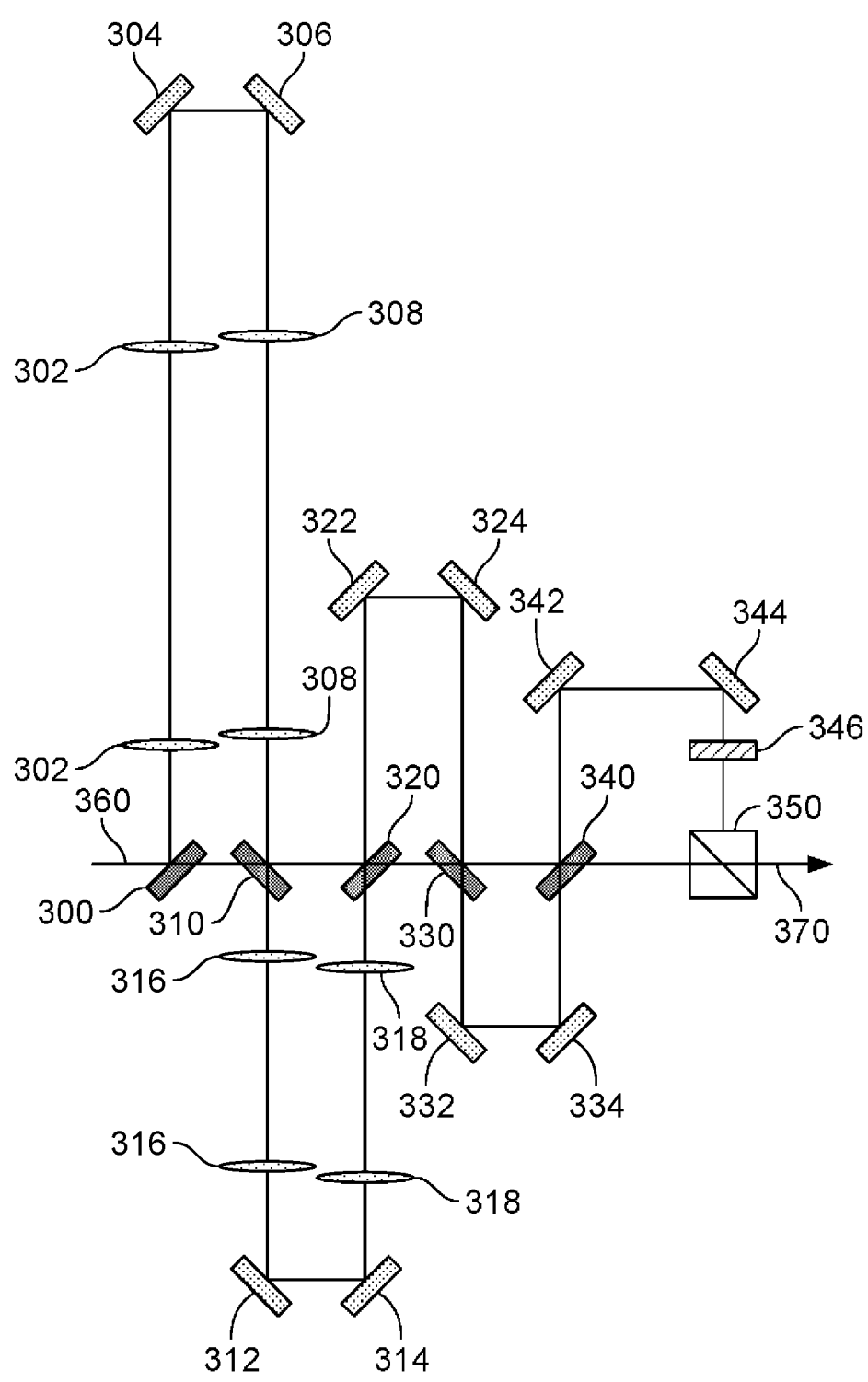
FIG. 3 is a diagram illustrating an embodiment of a delay system.

FIG. 3 is a diagram illustrating an embodiment of a delay system. In some embodiments, optical delay system of FIG. 3 is used to implement an optical delay system of an illumination system (e.g., illumination system 102 of FIG. 1). In the example shown, in this system, there are five delay paths, with the last one used to separate s- and p-polarization. This results in $2^5=32$ relatively incoherent pulses with different angles arriving at the output of the system. To produce the different angles, one of the mirrors in each arm is tilted and the result is observed at a pupil of the illumination system. The delay system produces beams that are parallel but separated in position. This approach: 1) produces parallel beam with lateral separation; 2) uses fewer optics (e.g., cheaper to fabricate and higher efficiency); and is easier to align by small tilts of each channel's mirror.

Input beam 360 passes on its original path through to output beam 370. A portion of input beam 360 is also reflected along one or more delay paths using beam splitter 300. For example, a portion of input beam 360 is reflected toward mirror 304 and mirror 306. In some embodiments, optical elements 302 and optical elements 304 are used for conditioning beam as it returns to input beam 360's original path.

The returning beam is reflected by beamsplitter 310 along original path of input beam 360 as well as transmitted along a second delay arm toward mirror 312 and mirror 314 before returning again to the original path of input beam 360. In some embodiments, optical elements 316 and optical elements 318 are used for conditioning beam as it returns to input beam 360's original path.

The returning beam is reflected by beamsplitter 320 along original path of input beam 360 as well as transmitted along a third delay arm toward mirror 322 and mirror 324 before returning again to the original path of input beam 360.

The returning beam is reflected by beamsplitter 330 along original path of input beam 360 as well as transmitted along a fourth delay arm toward mirror 332 and mirror 334 before returning again to the original path of input beam 360.

The returning beam is reflected by beamsplitter 340 along original path of input beam 360 as well as transmitted along a fifth delay arm toward mirror 342 and mirror 344 before returning again to the original path of input beam 360. After mirror 344, the beam is passed through a ½-wave plate to change the beam's polarization before being combined into the original path of input beam 360 by beamsplitter 350.

The main technical impact of this embodiment is improved speckle reduction and cost reduction (e.g., due to the simplification of the optics). These impacts amount to an increased competitive advantage and profitability for the delay system.

Dyson Delay System with Incrementally Larger Beam Splitters

Figure 4:
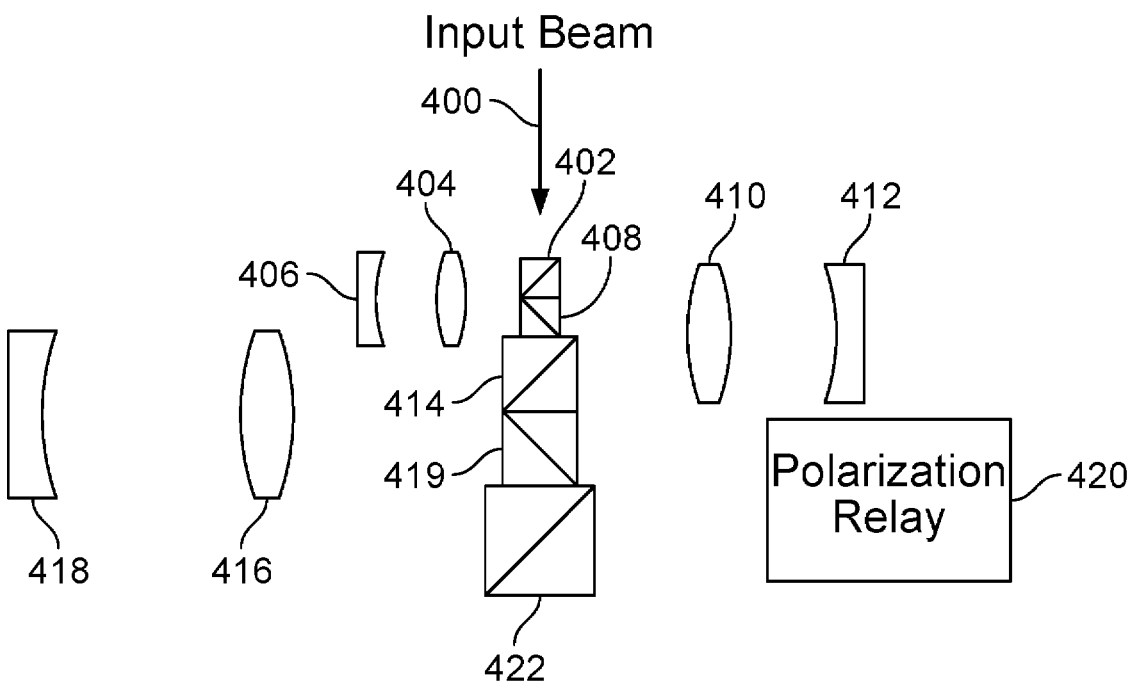
FIG. 4 is a diagram illustrating an embodiment of an optical delay system.

The problem of an increased complexity of the Dyson relay required to reduce aberrations for short path delays, is solved by using small beam splitters for the short paths, and larger beam splitters for the longer paths. The essential problem is that when the Dyson has a beam displacement large compared to its length, the aberrations become large. Using a smaller beam splitter reduces the field size and allows the lens to be simpler. The system performs basically as in FIG. 2A, except that the size of the beam splitters, and consequently, the field of view, and possibly size of the Dyson relays, increase from first to last as shown in FIG. 4. In some embodiments, the time delay system with the Dyson relays includes a set of different sized beamsplitters and arm optics (e.g., progressing from smaller sized beamsplitters to longer sized beamsplitters).

FIG. 4 is a diagram illustrating an embodiment of an optical delay system. In some embodiments, optical delay system of FIG. 4 is used to implement an optical delay system of an illumination system (e.g., illumination system 102 of FIG. 1). In the example shown, optical delay system receives an input beam 400 from a laser source (e.g., a pulsed laser source). Input beam 400 is partially reflected (e.g., first reflected ray) and partially transmitted (e.g., first transmitted ray) by beamsplitter 402. The first transmitted ray is focused by lens 404 onto a curved reflector 406 (e.g., in a Dyson lens configuration such that an entering light ray exits parallel to the entering ray but in the opposite direction) and is reflected back (e.g., first reflected back ray) and is made parallel to the entering first reflected ray by lens 404 (e.g., first exiting ray).

The first exiting ray is partially reflected (e.g., second reflected ray) and partially transmitted (e.g., second transmitted ray) by beamsplitter 408. The first transmitted ray is also transmitted to beamsplitter 408, enters beamsplitter 408 orthogonal to the first exiting ray, and is partially reflected (e.g., propagating parallel to the second transmitted ray and which will travel similar to the second transmitted ray) and partially transmitted (e.g., propagating parallel to the second reflected ray and which will travel similar to the second reflected ray).

The second transmitted ray is focused by lens 410 onto a curved reflector 412 (e.g., in a Dyson lens configuration such that an entering light ray exits parallel to the entering ray but in the opposite direction) and is reflected back (e.g., second reflected back ray) and is made parallel to the entering first exiting ray by lens 410 (e.g., second exiting ray).

The second exiting ray is partially reflected (e.g., third reflected ray) and partially transmitted (e.g., third transmitted ray) by beamsplitter 414. The second reflected ray is also transmitted to beamsplitter 414, enters beamsplitter 414 orthogonal to the second exiting ray, and is partially reflected (e.g., propagating parallel to the third transmitted ray and which will travel similar to the third transmitted ray) and partially transmitted (e.g., propagating parallel to the third reflected ray and which will travel similar to the third reflected ray).

The third transmitted ray is focused by lens 416 onto a curved reflector 418 (e.g., in a Dyson lens configuration such that an entering light ray exits parallel to the entering ray but in the opposite direction) and is reflected back (e.g., third reflected back ray) and is made parallel to the entering first exiting ray by lens 416 (e.g., third exiting ray).

The third exiting ray is partially reflected (e.g., fourth reflected ray) and partially transmitted (e.g., fourth transmitted ray) by beamsplitter 419. The third reflected ray is also transmitted to beamsplitter 419, enters beamsplitter 419 orthogonal to the third exiting ray, and is partially reflected (e.g., propagating parallel to the fourth transmitted ray and which will travel similar to the fourth transmitted ray) and partially transmitted (e.g., propagating parallel to the fourth reflected ray and which will travel similar to the fourth reflected ray).

The fourth transmitted ray is enters polarization relay 420 that generates oppositely-polarized oppositely-propagating parallel beams that are reflected by polarizing beamsplitter 422 to generate final exit beams parallel to initial input beam 400. Also, fourth reflecting beam is transmitted through polarizing beamsplitter 422 to be final exit beams also parallel to initial input beams 400.

In some embodiments, polarization relay 420 (which may be another Dyson) doubles the number of spots, but produces them at the orthogonal polarization (which could be linear, circular, or elliptical in general, but is most likely s- and p-polarization since this could be easily implemented with a half-wave-plate and a PBS as the last beam splitter).

Since the complexity (e.g., number of elements and aspheres) of the Dyson relay must increase with increased field of view (relative to its length), this embodiment makes it possible to reduce the field of view, and therefore the complexity, of the first Dysons. The longer Dysons, positioned farther along the path have larger beam splitters to accommodate the increasing array of spots, which are better accommodated by the longer lens systems.

In addition to the advantages of our prior art, this embodiment further reduces the cost of the optics by simplifying the shortest Dyson systems.

The main technical impact of the system is improved speckle reduction and cost reduction (by simplification of the optics and the alignment procedure). These impacts amount to an increased competitive advantage and profitability for the system.

Speckle Reduction by Spatially Distributed Time Delayed Beams

Figure 5A:
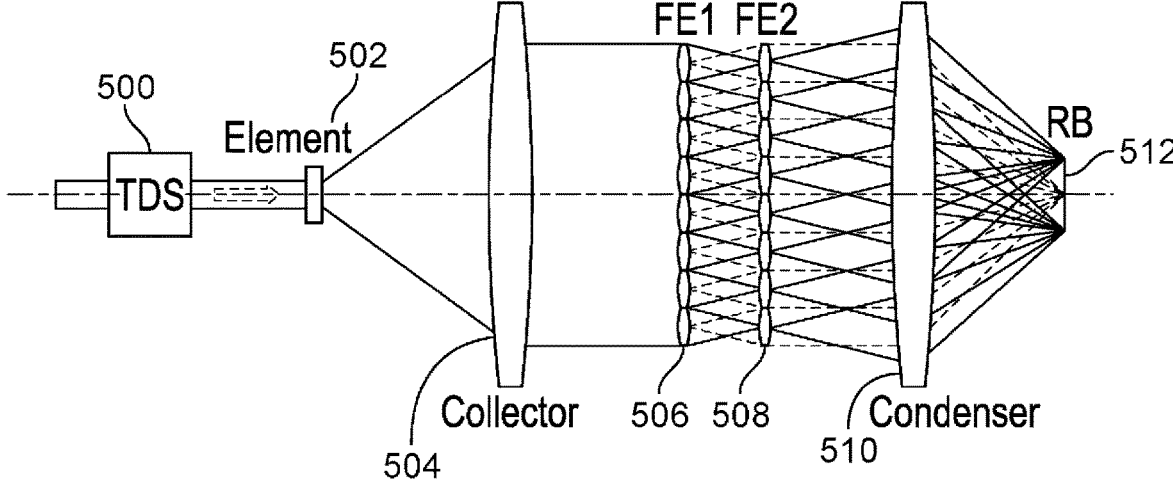
FIG. 5A is a diagram illustrating an example embodiment of a system for illumination.

FIG. 5A is a diagram illustrating an example embodiment of a system for illumination. In the example shown, the problem of minimizing speckle while maintaining uniform average illumination in a partially coherent projection utilizing a time delayed system is solved by shaping the beams leaving time delay system 500 (TDS) and distributing the beams to separate locations in the illumination pupil to minimize the spatial coherence as well as temporal coherence.

The approach used in the system uses element 502 (e.g., a diffractive optical element or a diffuser) to diffract/direct light (after being collected by collector 504) into the first fly's eye array (FE1 506) which then forms an image of element 502 in the elements of the second fly's eye array (FE2 508). The second fly's eye then projects the image of the first's elements into condenser 510, which then produces overlapping images of first fly's eye array (FE1 506) elements on the reticle blind (RB) 512, which is then relayed to a Spatial Light Modulator by another set of optics. Because RB 512 is conjugate with the Spatial Light Modulator, the remaining optics are not necessary in this description. The diffractive optical element or diffuser is disclosed in U.S. Pat. No. 5,850,300, the disclosed of which are hereby incorporated by reference. The Spatial Light Modulator is disclosed in U.S. Pat. No. 10,120,283, the disclosed of which is hereby incorporated by reference. The Spatial Light Modulator is conjugate to the reticle blind plane. It could be in place of the reticle blind. In some embodiments, there may be a lens that relays the image of the reticle blind to the Spatial Light Modulator.

The trouble being addressed here is that in this system the field at FE2 is correlated between FE2 elements because element 502 illuminates all points in the pupil with all parts of the input beam leaving the time delay system 500.

In some embodiments, time delay system 500 comprises the optical delay system of FIG. 2A. For time delay system 500, the output beams are all parallel, but each path produces beam with a unique position via placement of each of the mirror+lens relays. Each of these beams is directed to a desired position in the illumination pupil so that the spatial coherence is minimized.

Figure 5B:
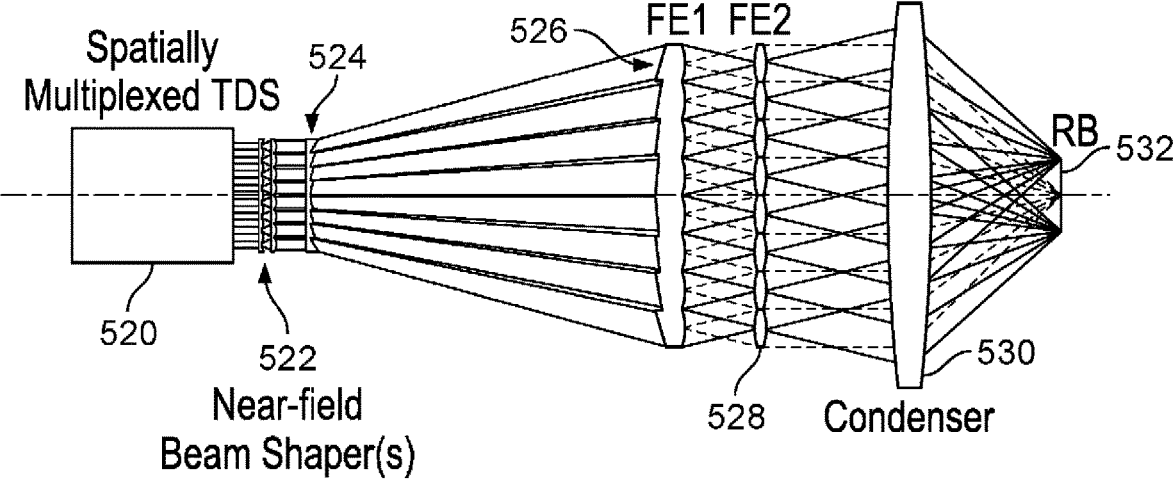
FIG. 5B is a diagram illustrating an embodiment of a system for illumination.

FIG. 5B is a diagram illustrating an embodiment of a system for illumination. In the example shown, spatially multiplexed time delay system 520 processes an input beam to generate multiple output beams that are directed toward near field beam shaper 522. One of the key points to the above pictured embodiment is the existence of beamlet steering optic 524, beamlet steering optic 526 (first fly's array FE1), beamlet steering optic 528 (second fly's array FE2), and condenser 530. These components steer each beamlet to a desired location in the pupil. The diagram shows a uniformly distributed set of beams, but the beam steering can, in principle, place the beams in any arrangement such as dipole, quadrupole, or annulus.

One of the key problems that must be solved is how to achieve the low spatial coherence while also producing a uniform distribution at the reticle blind 532 (RB). In some embodiments, this is solved by placing each differently-time-delayed beam in a separate location in the pupil. In some embodiments, the system first converts the round Gaussian beams leaving spatially multiplexed time delay system 520 into square top-hat beams (e.g., a flat irradiance distribution) using aspheric beamlet shaping optics (e.g., near-field beam transformers), and then completely, and uniformly, illuminating a single FE1 element. The FE1 element comprises an array of lenslets each corresponding to a beamlet as output from the shaping optics. With fully illuminated FE1 elements, the RB illumination will also be uniform.

Figure 5C:
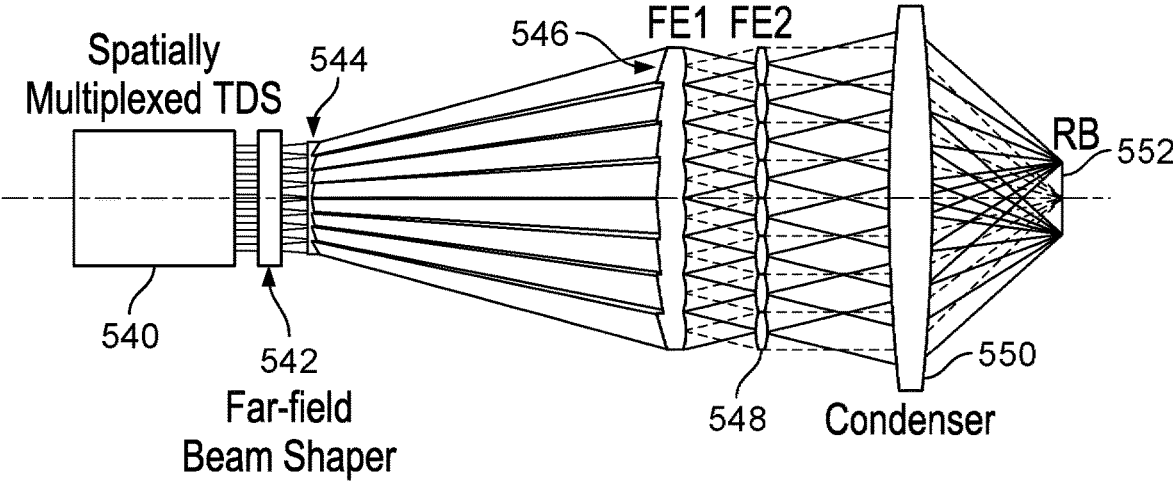
FIG. 5C is a diagram illustrating an embodiment of a system for illumination.

FIG. 5C is a diagram illustrating an embodiment of a system for illumination. In the example shown, spatially multiplexed time delay system 540 processes an input beam to generate multiple output beams that are directed toward far field beam shaper 542. One of the key points to the above pictured embodiment is the existence of beamlet steering optic 544, beamlet steering optic 546 (first fly's array FE1), beamlet steering optic 548 (second fly's array FE2), and condenser 550. These components steer each beamlet to a desired location in the pupil. The diagram shows a uniformly distributed set of beams, but the beam steering can, in principle, place the beams in any arrangement such as dipole, quadrupole, or annulus.

One of the key problems that must be solved is how to achieve the low spatial coherence while also producing a uniform distribution at the reticle blind 552 (RB).

This embodiment offers reduced speckle through lower spatial coherence while maintaining the ability to provide uniform illumination at the reticle blind.

Figure 5D:
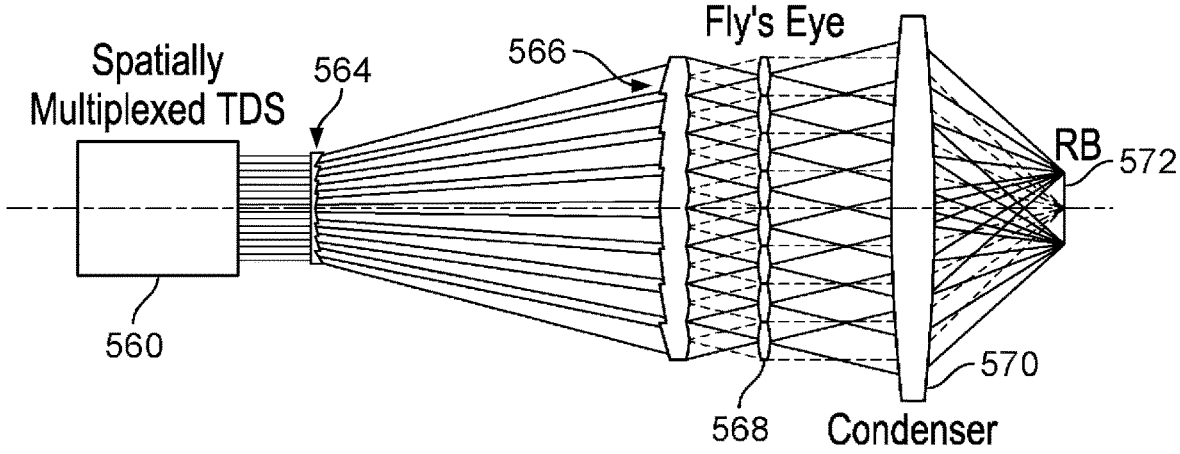
FIG. 5D is a diagram illustrating an embodiment of a system for illumination.

FIG. 5D is a diagram illustrating an embodiment of a system for illumination. In the example shown, the system is a simplification and improvement to the approach taken in FIG. 5B and FIG. 5C. There are two beam shaping elements (elements 564 and elements 566) for each beam (or beamlet). The arrays (elements 564 and elements 566) are used for beamlet steering and shaping, and in combination rearrange the beams leaving time delay system (TDS) 560 to desired positions at the reticle blind (RB) 572. To accomplish this, the first array (elements 564) imparts a deflection to each beam, and the elements of the second array (elements 566), which are positioned to receive the beams, remove the deflection (or re-direct them in to the condensing optics (fly's eye 568 and condenser 570)). The deflection of elements 564 and elements 566 can be achieved by either tilting the refracting surface, including a linear phase component to a hologram or metasurface, or using a tilted reflecting surface.

The second role of the arrays is beam shaping. This is different from the approach taken in FIG. 5B and FIG. 5C, where separate elements were used to shape the beam. In this case, each element of the first array (elements 564) is curved (either in its reflecting or refracting surface, or in the phase of a hologram or metasurface) to produce a beam with the desired shape (or close to the desired shape) at the second array (elements 566). The shaping effect of the first array (elements 564) can be assisted by spatially varying the transmission amplitude as well as phase, which can be achieved with spatially varying transmission or reflectance (as adjusted with a thin film coating) or by varying the diffraction efficiency of a hologram or metasurface. Furthermore, the transmission variation could be achieved with a separate element placed close the first. The second array elements (elements 566), besides re-directing the beams, can be made to improve the beam shape by reshaping the phase (either by surface shape or hologram/metasurface phase) and/or reshaping the amplitude.

In addition, there is another array (fly's eye 568) that images the first array elements (elements 564) to a position that allows the condenser lens (condenser 570) to overlay the beams at the target plane of RB 572.

Figure 5E:
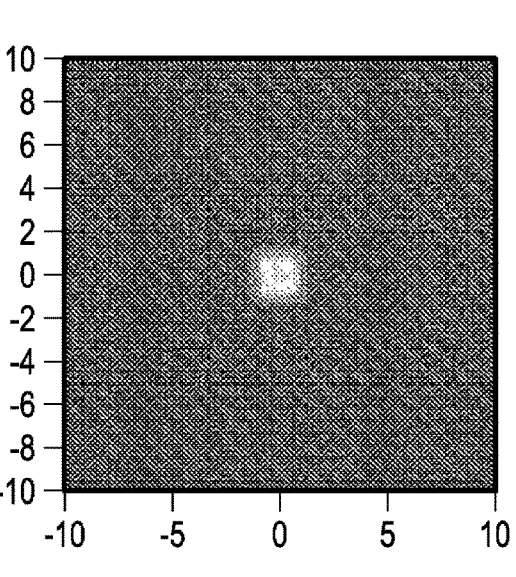
FIG. 5E shows a beam shape obtained by the embodiment of the system for illumination illustrated in FIG. 5D.

In some embodiments, the beam shaping of the first array (elements 564) is achieved with the "double hyperbola" surface described by the equation:

$$\phi = \frac{2\pi}{\lambda} \left\{ \frac{c_x x^2}{\left(1 + \sqrt{1 - (1 + k_x)}\right) c_x^2 x^2} + \frac{c_y y^2}{\left(1 + \sqrt{1 - (1 + k_y)}\right) c_y^2 y^2} \right\}$$

Where ex and cy are the two principal curvatures and kx and ky are the principal conic constants. The system is optimized for a square beam so that cx=cy and kx=ky, with values of cx=19.1/mm and kx=−31980 to obtain beam shape in FIG. 5E where the wavelength=760 nm and with a Gaussian beam radius of 0.5 mm (axes are in mm).

Figure 5F:
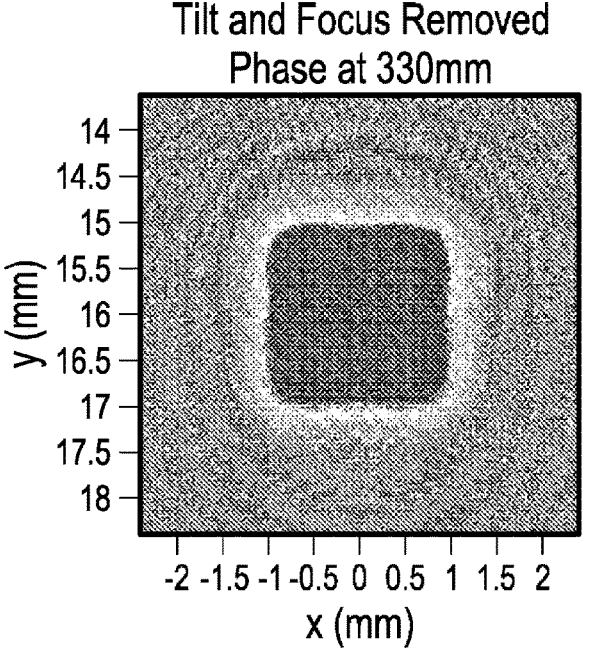
FIG. 5F shows a simulated phase of each beam arriving at a second array in the embodiment of the system for illumination illustrated in FIG. 5D.

The simulated phase of each beam arriving at the second array (elements 566) is shown by FIG. 5F (by simulation). The role of the second array element (elements 566) is then to flatten the irradiance (above) and phase below. The system uses diffractive elements for both arrays (elements 564 and elements 566) with no transmission variation in the first element (elements 564) and both phase and amplitude flattening in the second (elements 566).

In various embodiments, the beam steering places the beams in any desired arrangement such as having an overall shape of a square, a rectangle, a dipole, a quadrupole, or an annulus.

Figure 6:
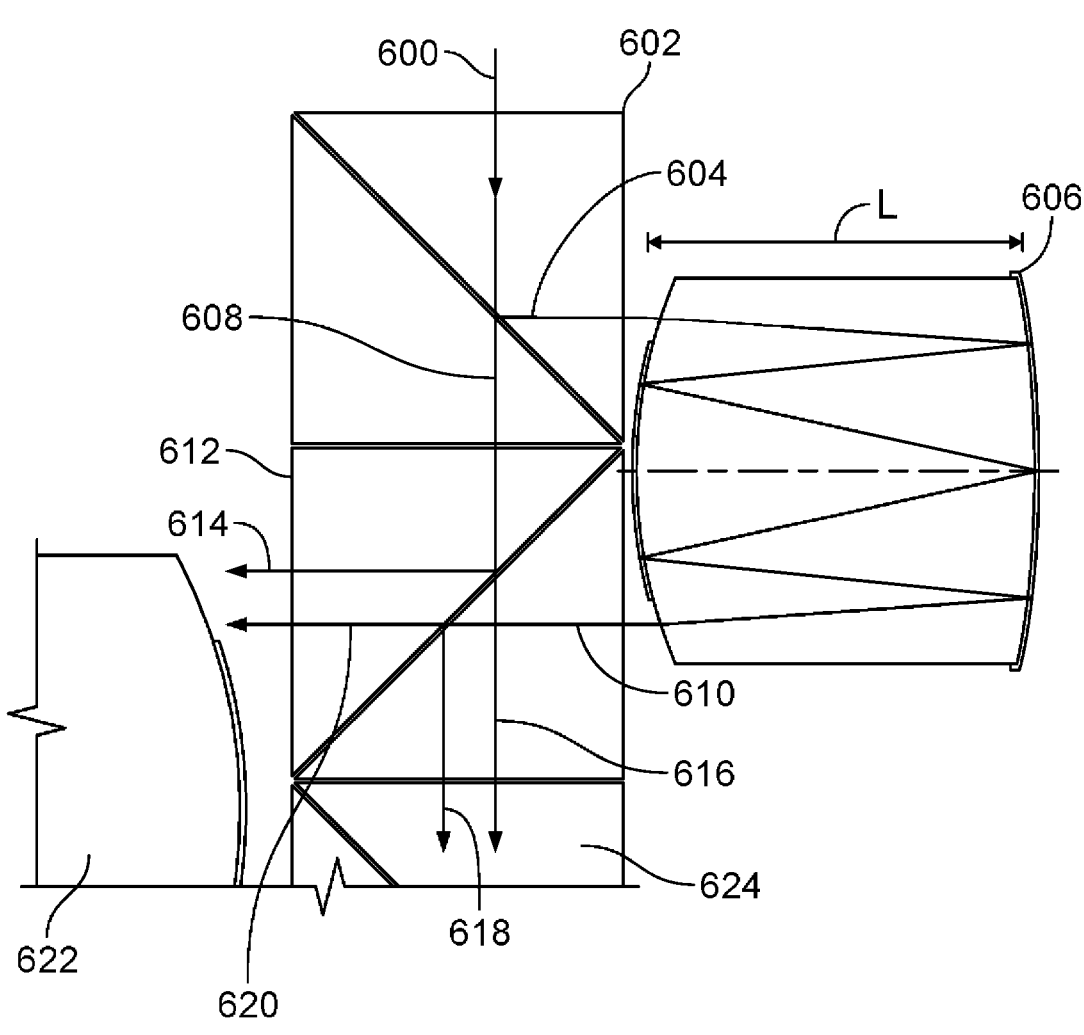
FIG. 6 is a diagram illustrating an embodiment of a time delay system using folded solid optics.

FIG. 6 is a diagram illustrating an embodiment of a time delay system using folded solid optics. In FIG. 2A and FIG. 3 each of the delay arms is progressively longer. For example, in FIG. 2A the length of each Dyson relay is approximately half each of the delay lengths. If the shortest delay length is, for example, 20 mm, and there are 8 delay arms, the shortest arm length is 10 mm and the longest is 10 mm*2^8=5.12 m. This is rather long. The system could be trivially folded back and forth, but the configuration in FIG. 6 provides a way that is easier to fabricate and align.

In the example shown, beam 604 enters beamsplitter 602 and is split into beam 604 and beam 608. Solid catadioptric lens 606 is utilized to fold beam 604 and relay beam 604 to the next beam splitter (e.g., beam splitter 612) of the time delay system (TDS). Solid catadioptric lens 606 includes a first surface with a transmitting region and a reflecting region. The transmitting region refracts the beam into the optic where it makes five reflections before being refracting again toward the conjugate location (e.g., exiting beam 610). The time delay system's next beamsplitter (beam splitter 612) has two input beams (e.g., beam 608 and beam 610) which are split and sent to solid catadioptric lens 622 and a next beam splitter (e.g., beamsplitter 624). Beam 608 is split into beam 614 which is directed toward solid catadioptric lens 622 and beam 616 which is directed toward beamsplitter 624. Beam 610 is split into beam 620 which is directed toward solid catadioptric lens 622 and beam 618 which is directed toward beamsplitter 624.

In this approach, the two extra foldings means that the delay arm is ⅓ as long as the Dyson. The fact that the path is in glass (which typically has a refractive index around 1.5) provides another factor of 1.5. The result is a total length reduction of 4.5× over time delay circuit of FIG. 2 A.

Other embodiments include:

Discontinuous or aspheric surfaces where the different refractions and reflections at a single surface encounter different curvatures Freeform surfaces that correct astigmatism A transmitting region in the second surface to allow the beam to reflect at an independently tiltable mirror, which can be useful in alignment/adjustment of the TDS Even more folds—it is conceivable to increase the number of reflections at the cost of field of view. In such cases, the total length reduction is (m+1)*1.5/2 where m is the number of reflections The advantage of this embodiment over a more conventional approach of simply folding the path with planar mirrors, is that the monolithic design requires far fewer parts and relatively easy alignment.

Overall, although the individual elements may be more expensive, it should result in a much more cost effective TDS—especially if large numbers (n>5) delay arms are needed.

Figure 7:
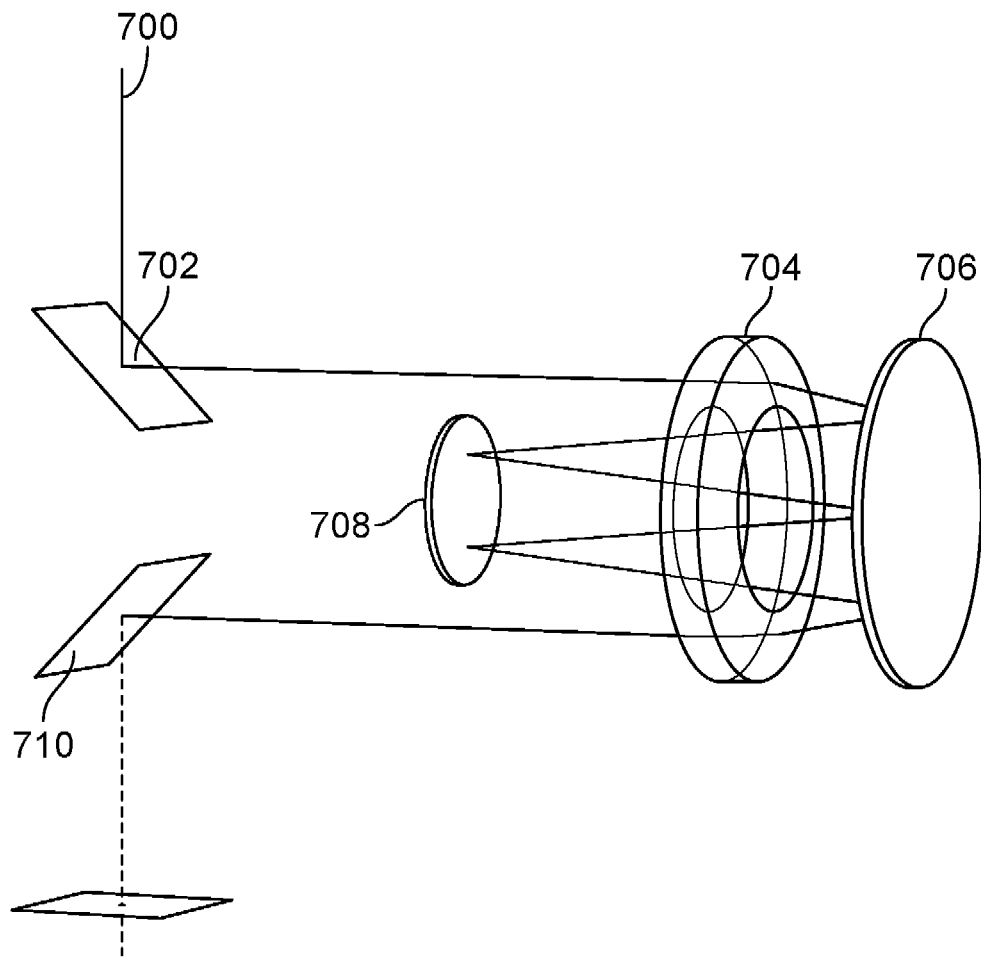
FIG. 7 is a diagram illustrating an embodiment of a delay element.

FIG. 7 is a diagram illustrating an embodiment of a delay element. In some embodiments, the delay element in FIG. 7 is used to implement an arm of an optical delay system of FIG. 2A or FIG. 4. In the example shown, the problem of time delay system size is solved using folded segmented optics. A fold is added to a delay arm by removing the center material of lens 704 in the optical path of the delay arm. Beam 700 is reflected into the arm using beamsplitter 702. There is an additional beam path that does not go to the delay arm (not shown) that propagates directly through beamsplitter 702 and 710. The beam is then refracted by lens 704 and reflected by mirror 706 to mirror 708. The beam reflects back to mirror 706 using mirror 708. Again the beam is reflected by mirror 706 to mirror 708 and back to mirror 706 before being refracted again by lens 704. The beam exits the delay arm by rejoining the original beam using beamsplitter 710. Mirror 706 now has three reflections of the beam instead of just one. An additional mirror (mirror 708) provides additional folds, further reducing the physical space of the optical path. With this design the two surfaces of lens 704, and the surfaces of each mirror (mirror 706 and mirror 708), can be independent design constraints. In some embodiments, mirror 706 comprises a concave mirror. In some embodiments, mirror 708 comprises a convex mirror. In some embodiments, mirror 706 and mirror 708 are arranged along a common optical axis. In some embodiments, the common optical axis is decentered from a virtual ridge line of beamsplitter surfaces of beamsplitter 702 and beamsplitter 710. In the embodiment of FIG. 7, lens 704 is optional. In some embodiments, the delay element is constructed using mirror 706 and mirror 708.

In some embodiments, since the propagation lies in a plane, the lens can be replaced with lens segments instead of a lull annulus. The large mirror (mirror 706) could also be split into segments increasing the number of free parameters available. Alignment would become increasing difficult and should be avoided for most systems.

In some embodiments, additional lens/mirror sets could be nested to further compact the system, but would also increase the difficulty and complexity of manufacture and alignment.

Additional embodiments could include: 1) Mangin mirrors; and 2) freeform surfaces.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An optical system comprising:
a first optical system which divides an input beam into a first light and a second light and directs the first light and the second light to different directions;
a second optical system, which is different from the first optical system, and includes (i) a concave reflective surface which reflects the first light and (ii) a lens through which the reflected first light passes; and
a third optical system that is different from the first optical system and the second optical system, the first light reflected from the concave reflective surface of the second optical system entering into the third optical system from a first direction without passing through the first optical system but having passed through the lens of the second optical system, the second light from the first optical system entering into the third optical system from a second direction different from the first direction, and the third optical system directing the first light and the second light to an output optical path of the third optical system.

2. The optical system according to claim 1, wherein the second optical system includes a refractive member arranged between the first optical system and the concave reflective surface.

3. The optical system according to claim 2, wherein the refractive member is arranged between the concave reflective surface and the third optical system.

4. The optical system according to claim 2, wherein the refractive member has a rear focal point substantially positioned on the concave reflective surface.

5. The optical system according to claim 1, wherein the second optical system includes a reflective surface which reflects the first light from the concave reflective surface, and wherein the concave reflective surface reflects the first light from the reflective surface of the second optical system.

6. The optical system according to claim 5, further comprising a refractive member arranged between the concave reflective surface and the reflective surface.

7. The optical system according to claim 6, wherein the concave reflective surface and the reflective surface are formed on the refractive member.

8. The optical system according to claim 5, wherein the reflective surface has a concave shape.

9. The optical system according to claim 5, wherein the reflective surface has a convex shape.

10. The optical system according to claim 1, wherein the concave reflective surface faces a beam path of the second light between the first optical system and the third optical system.

11. The optical system according to claim 1, wherein the first light from the third optical system and the second light from the third optical system pass through different positions.

12. The optical system according to claim 1, further comprising a fourth optical system including a concave reflective surface which reflects the first light from the third optical system.

13. The optical system according to claim 12, wherein an optical axis of the second optical system and an optical axis of the fourth optical system are decentered from each other.

14. The optical system according to claim 12, wherein the third optical system divides the first light from the second optical system into a third light and a fourth light.

15. The optical system according to claim 14, further comprising a fifth optical system arranged in the output path of the third optical system.

16. An optical system comprising:
a time delay system including:
   a first optical element which (i) divides an input beam that is from an illumination source and has not passed through any diffractive element into a first light and a second light and (ii) directs the first light and the second light to different directions;
   a second optical element into which the first light and the second light enter from different directions, the second optical element (i) combining a part of the first light and a part of the second light so as to output a third light to a first direction and (ii) combining a part of the first light and a part of the second light so as to output a fourth light to a second direction that is different from the first direction;
   a third optical element into which the third light and the fourth light enter from different directions, the third optical element combining a part of the third light and a part of the fourth light so as to output a fifth light; and
   a first fly's eye into which the fifth light enters to illuminate a target plane.

17. The optical system according to claim 16, wherein the time delay system comprises multiple arms that are traversed such that each beamlet of a set of beamlets that are generated by the time delay system traverses a different permutation of the multiple arms in order to reduce temporal coherence between each beamlet of the set of beamlets.

18. The optical system according to claim 16, wherein the illumination source comprises a pulsed laser.

19. The optical system according to claim 16, wherein the system is configured to dispose a reticle at the target plane.

20. The optical system according to claim 19, wherein the system is configured to project an image of the reticle on a wafer.

21. The optical system according to claim 16, wherein the time delay system includes a set of different sized beam-splitters and arm optics.

22. The optical system according to claim 16, further comprising a near field beam shaper to shape a set of beamlets output by the time delay system.

23. The optical system according to claim 16, further comprising a far field beam shaper to shape a set of beamlets output by the time delay system.

24. The optical system according to claim 16, wherein the time delay system includes multiple time delay arms, and wherein a light path in an arm of the multiple time delay arms is folded.

25. The optical system according to claim 24, wherein the light path in the arm is substantially in glass.

26. The optical system according to claim 24, wherein the light path in the arm is substantially in air.

27. The optical system according to claim 24, wherein the light path is folded N times.

28. The optical system according to claim 16,
wherein the first optical element is provided so that each of the first light and the second light does not enter the first optical element from a direction where the input beam enters the first optical element, and
wherein the second optical element is provided so that each of the third light and the fourth light (i) does not enter the second optical element from a direction where the first light enters the second optical element and (ii) does not enter the second optical element from a direction where the second light enters the second optical element.

29. The optical system according to claim 16,
wherein a length of a first path through which the first light passes, the first path being between the first optical element and the second optical element, is different from a length of a second path through which the second light passes, the second path being between the first optical element and the second optical element.

30. The optical system according to claim 16, wherein the fifth light includes a plurality of beams irradiated at spatially different positions within the target plane.

31. A lithography system comprising:
an illumination source;
the optical system according to claim 16, the illumination system illuminating the target plane by light from the illumination source; and
a projection lens which projects an image of the target plane.

32. An optical system comprising:
a beam divider which divides an input beam into a first light and a second light and directs the first light and the second light to different directions;
an intermediate optical part including a refractive surface, which refracts the first light, and a concave mirror that reflects the first light from the refractive surface; and
a beam combiner which is different from the beam divider and directs the first light and the second light from the concave mirror to a same direction,
wherein the first light from the concave mirror of the intermediate optical part enters the beam combiner from a first direction without passing through the beam divider but having passed through the refractive surface of the intermediate optical part.

33. The optical system according to claim 32, wherein the intermediate optical part includes an optical axis, and wherein the first light entering the intermediate optical part is decentered from the optical axis.

34. The optical system according to claim 33, wherein a midpoint between a beam divided point at the beam divider and a beam passing point of the second light on a beam combined surface of the beam combiner is decentered from the optical axis of the intermediate optical part.

35. An optical system comprising:

a beam divider which divides an input beam into a first light and a second light and directs the first light and the second light to different directions;

an intermediate optical part including a first surface, which reflects the first light from the beam divider and which has concave shape, and a second surface that reflects the first light from the first surface and directs the first light to the first surface; and a beam combiner, the first light from the second surface entering the beam combiner from a first direction without passing through the beam divider, the second light entering the beam combiner from a second direction different from the first direction, and the beam combiner directing the first light from the second surface and the second light to a same direction, wherein the first light traveling from the second surface to the beam combiner passes through the first surface.

*     *     *     *     *